United States Patent [19]

Muterspaugh

[11] Patent Number: 4,476,583
[45] Date of Patent: Oct. 9, 1984

[54] ELECTRONIC TRACKING FOR TUNERS
[75] Inventor: Max W. Muterspaugh, Indianapolis, Ind.
[73] Assignee: RCA Corporation, New York, N.Y.
[21] Appl. No.: 470,574
[22] Filed: Feb. 28, 1983
[51] Int. Cl.³ ............................................. H04B 1/26
[52] U.S. Cl. .................................. 455/180; 455/191; 455/197; 455/340
[58] Field of Search ............... 455/168, 180, 188-191, 455/197, 340; 358/191.1

[56] References Cited

U.S. PATENT DOCUMENTS

| 3,440,544 | 4/1969 | Pampel . | |
|---|---|---|---|
| 3,517,352 | 6/1970 | Marshall et al. . | |
| 3,633,119 | 1/1972 | Balbes . | |
| 3,835,424 | 9/1974 | Marik . | |
| 4,146,850 | 3/1979 | Fache et al. . | |
| 4,162,452 | 7/1979 | Ash | 455/180 |
| 4,247,953 | 1/1981 | Shinagawa et al. | 455/180 |
| 4,334,323 | 6/1982 | Moore . | |
| 4,402,089 | 8/1983 | Knight . | |
| 4,408,348 | 10/1983 | Theriault | 455/180 |
| 4,418,427 | 11/1983 | Muterspaugh | 455/180 |
| 4,418,428 | 11/1983 | Evans | 455/180 |

FOREIGN PATENT DOCUMENTS 1584738   2/1981   United Kingdom .

OTHER PUBLICATIONS

German Language Article, "Digitaler Suchlauf fur einen UKW-Empfanger" (Digital Station Finding for a VHF Receiver), by Henno Schotten appearing in *FUNKSHAU*, vol. 43, Sep. 1, 1971, pp. 535-537, and a translation of it.

Primary Examiner—Jin F. Ng
Attorney, Agent, or Firm—Eugene M. Whitacre; Peter M. Emanuel; Lawrence C. Edelman

[57] ABSTRACT

A tuning system for a receiver for providing an IF signal from a selected one of RF signals residing in a signal frequency band, comprises filter means for passing RF signals corresponding to a selected channel in response to a filter tuning control signal, mixing means responsive to the selected RF signals and a local oscillator signal for frequency translating the selected RF signals to develop a predetermined IF signal and a local oscillator for generating the local oscillator signal in response to an oscillator tuning control signal. A DC signal translating means includes an amplifier having an input responsive to the oscillator tuning control signal and having first and second predetermined gain transfer characteristics for modifying the oscillator tuning control signal and for providing at an output the filter tuning control signal. A switch means responsive to one of the tuning control signals changes the gain characteristic of the amplifier from the first characteristic to the second, so as to derive a piecewise-linear approximation of the filter tuning control signal from the oscillator tuning control signal.

13 Claims, 4 Drawing Figures

ELECTRONIC TRACKING FOR TUNERS

The present invention relates to tuning systems employing a radio frequency stage and a local oscillator with respective tuned circuits which desirably track each other over a given tuning range.

Television (TV) tuning systems heterodyne a radio frequency (RF) signal corresponding to a desired channel received from broadcast or cable TV signal sources with a local oscillator signal having a frequency set in accordance with the desired channel in order to produce an intermediate frequency (IF) signal from which display and sound information is derived. The frequency of a local oscillator signal is commonly controlled by a tuning voltage. The tuning voltage is developed in response to the selection of a channel by a viewer in any one of a variety of well known ways which may be generally characterized as either voltage synthesis or frequency synthesis. In voltage synthesis the tuning voltages for tuning each channel is stored in either analog form by means of a potentiometer or in digital form in an addressable memory. In frequency synthesis the frequency of the local oscillator or the IF signal is compared to a reference frequency and the tuning voltage is changed until the two frequencies are equal. Typically frequency synthesis is accomplished by a phase-locked loop.

In addition to tuning the local oscillator, the tuning voltage for the local oscillator (LO) can be employed to adjust the frequency selectivity of tunable RF filter circuits which precede the mixer to pass only the RF signal of the selected channel. When the passband of the RF filter circuits does not properly track the frequency of the local oscillator signal (such that the frequency difference is precisely the IF frequency), the desired RF signal may be attenuated and the possibility of interference from adjacent TV channels is increased. While increasing the bandwidth of the RF filter circuits might help reduce attenuation of the desired RF signal in a case of mistracking, it could also worsen the interference problem.

Since the voltage variable capacitance ("varactor") diodes in the the RF filter and local oscillators circuits receive a common tuning voltage but do not have precisely the same tuning characteristics over the tuning range of their respective frequency ranges, mechanically variable inductors and capacitors have been used as trimming elements in the RF filter and LO circuits to cause the frequency characteristics of these circuits to track one another in response to the tuning voltage. The adjustment of these trimming elements is difficult and time consuming, often requiring an iterative procedure. Additionally, they increase the wear and tear on the mechanical portions of the adjustable elements which increases the probability of component failure. Trimming and padding components may also reduce the overall range of frequency variation of the local oscillator to a point where a separate local oscillator is required for each TV band, i.e., low VHF, mid band cable, high VHF, super band cable and UHF bands.

Additionally, in a double-conversion or double-heterodyning tuning system, wherein two frequency conversions are performed to translate the frequency of the received RF signal to a first IF signal and then to a second and final IF signal, RF/LO frequency tracking is even more difficult to achieve. In these double-conversion tracking systems the frequency range of the local oscillator required to generate the first IF signal is generally much higher than that of the received RF signals which must be selected by the RF filter circuits. In a voltage controlled tuner this disparity of frequency ranges makes it difficult to adjust the LO and RF circuits to track one another. When mechanical tracking adjustments are employed, at high frequencies encountered in double-conversion tuning systems, the nearness of an adjusting tool or the hand of the person making the adjustment significantly interferes with the adjustment process.

The present invention concerns a tuning system in which the initial or factory tracking adjustment of the RF and LO circuits is relatively simple. It also allows for electronic tracking of the tuning voltages for the RF and LO tuned circuits, even when a single local oscillator is used for tuning both the low VHF and high VHF television signal bands.

In the present invention, a tuning system for a receiver for providing an IF signal from a selected one of RF signals residing in a signal frequency band, comprises filter means for passing RF signals corresponding to a selected channel to a filter tuning control signal, mixing means responsive to the selected RF signals and a local oscillator signal for frequency translating the selected RF signals to develop a predetermined IF signal and a local oscillator for generating the local oscillator signal in response to an oscillator tuning control signal. A DC signal translating means includes an amplifier having an input responsive to said oscillator tuning control signal and having first and second predetermined gain transfer characteristics for modifying the oscillator tuning control signal and for providing at an output the filter tuning control signal. A switch means responsive to one of the tuning control signals changes the gain characteristic of the amplifier from the first characteristic to the second, so as to derive a piecewise-linear approximation of the filter tuning control signal from the oscillator tuning control signal.

Figure 1:
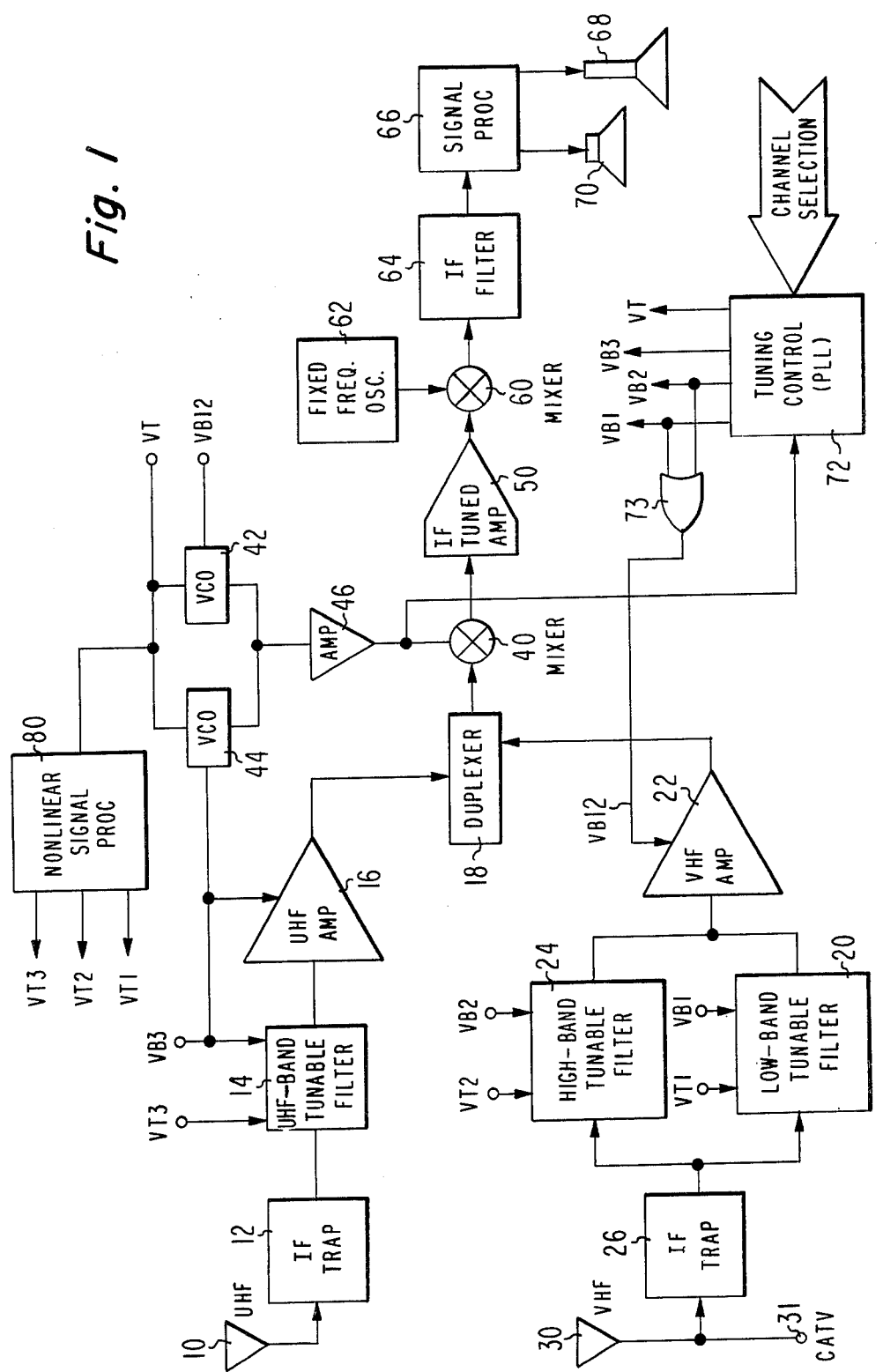
FIG. 1 illustrates, in block diagram form, a television receiver including a tuning system constructed in accordance with principles of the invention.

In the double conversion tuning system of FIG. 1, RF television signals for broadcast and cable channels are received at UHF antenna input 10, at VHF antenna input 30 and at CATV input 31. In the United States, each channel is allocated about 6 MHz of bandwidth in the frequency spectrum and has a picture carrier at a frequency 1.25 MHz higher than the frequency at the lower limit of its pre-assigned channel bandwidth. The channel numbers and frequency bands of the received RF signals are indicated in the following table:

TABLE 1

| TV Band | Frequency Range (megaHertz) | Channel Desig. | Tuning Band |
|---|---|---|---|
| Low VHF Broadcast (L-VHF) | 54 to 88 | 2 to 6 | Low |
| Midband Cable | 90 to 174 | A-5 to I | | desired IF frequency. In other words, the frequency selectivities of the tunable filters are made to track their frequency of the respective local oscillator signal by non-linear signal processing ciruit 80 for proper heterodyning.

In the prior art where the same VT is applied to a local oscillator and a respective RF stage, trimming and padding capacitors and inductors are adjusted in the tuned circuits of the local oscillator and RF stage in order to force their tuned circuit responses to achieve the required frequency tracking relationship. As previously noted, the use of these adjustable reactances is undesirable since they require difficult and time-consuming factory alignment procedures, introduce structural integrity problems and, due to the additional reactances, tends to reduce the range of frequency variations obtainable by the tuned circuits. As to the latter point, prior art tuning system for tuning RF signals in the five bands noted in Table 1, typically required separate VCO's for tuning the Low and High bands, due to the addition of reactive components which were necessary to achieve satisfactory RF/LO tracking. Non-linear signal processing circuit 80 eliminates the need for additional adjustable reactive components to achieve tracking in the tunable filters and VCO's and therefore eliminates their disadvantages. Due to the elimination of these reactive trimming elements, which, as earlier noted, tends to limit the frequency range of the associated tunable circuit, a single VCO can be used for generating the local oscillator signal, e.g., 471-813 MHz for the Low and High bands. A preferred embodiment for processor 80 will be described with reference to FIGS. 2a, 2b and 3.

Figure 2A:
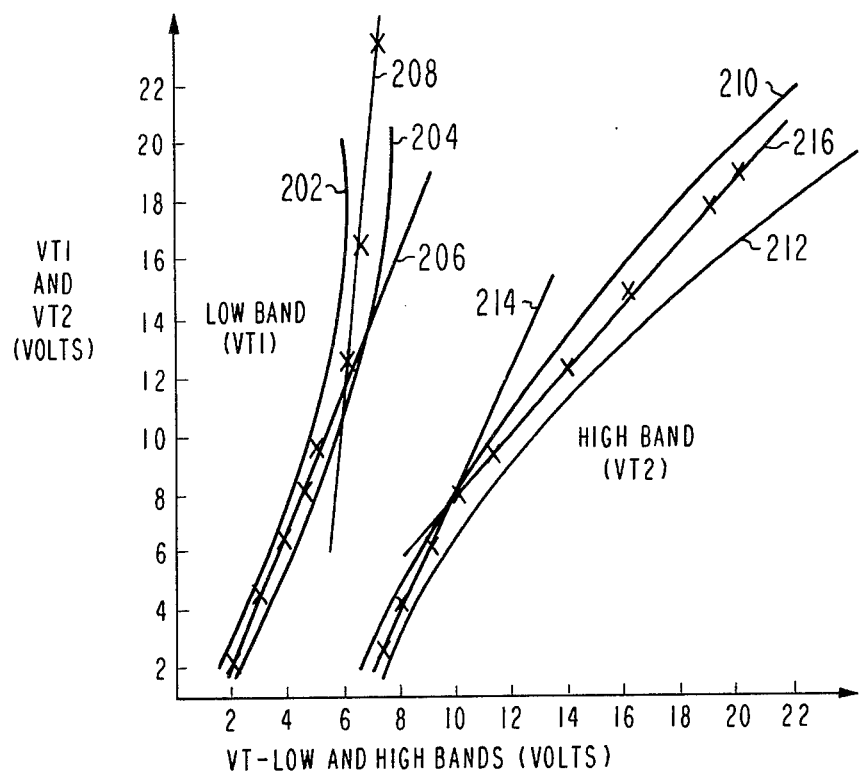
FIGS. 2a and 2b illustrate graphic representations of the desired tracking characteristic between the tuning voltages of the RF and local oscillator circuits.
Figure 2B:
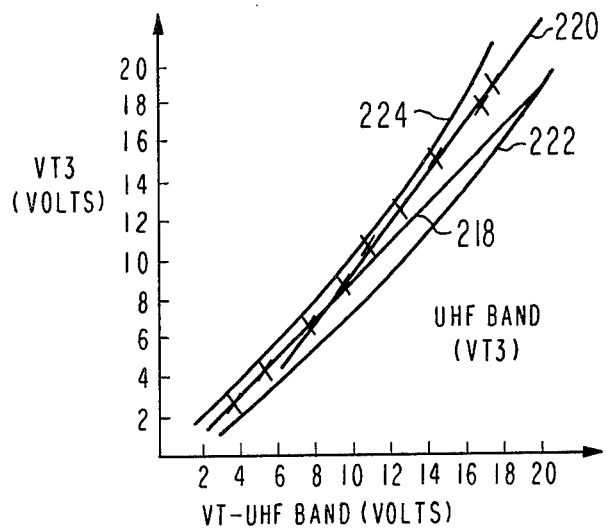

FIGS. 2a and 2b graphically illustrate the tracking relationship required in order that the RF signals corresponding to the selected channel are properly heterodyned to the first IF frequency. The tuning voltage VT1 required for low band tunable filter 20 includes the range of voltages between curves 202 and 204. Since the passband of the tunable filter is greater than the bandwidth of the RF signals for the various channels, the tuning voltage VT1 may be within the range of voltages shown between curves 202 and 204 and still pass the selected channel. Note that as the frequency is increased towards the higher end of the MB-CATV band, the tolerance requirement for the RF/LO tuning voltage tracking is relaxed, due to the increased bandwidth of the filter towards the high end of the tuning range. A curve centered between curves 202 and 204 (identified with "X's") provides ideal RF/LO frequency tracking. Due to the above-noted relaxed tolerance, only two intersecting straight lines 206 and 208 are required to provide a piecewise-linear approximation of the ideal tracking curve.

Curves 210 and 212 of FIG. 2a show the voltage range allowed for proper RF/LO tuning voltage tracking in the High band. Again, note that only two intersecting straight line segments 214 and 216 are required to provide piecewise-linear approximation of the ideal tracking curve centered between curves 214 and 216. FIG. 2b graphically illustrates piecewise-linear approximation using straight lines 218 and 220 for providing an acceptable piecewise-linear approximation of the ideal RF/LO tuning voltage tracking between curves 222 and 224 for the UHF band.

As previously noted, when individual tuning voltages are generated for the oscillators and tunable filters, adjustable reactive components for providing tracking of the tuned circuit characteristics are substantially eliminated and the frequency range of the oscillators is increased. As is indicated schematically in FIG. 1 and graphically in FIG. 2a, VCO 42 is able to supply LO signals for both the Low and High bands using a single tuning voltage VT from about 2 to about 22 volts. Thus, VCO 42 does not require any switched reactive components (typically a second inductor in the VCO tuned circuit which is coupled or decoupled in response to band switching signals) for changing the tuned circuit response so as to provide proper RF/LO signal frequency tracking. However, if it is desired to generate the filter tuning voltages from the VCO tuning voltages, it is clear from FIG. 2a that processor 80, for the Low band must provide a voltage increase in order that a 2 to about 23 volt filter tuning voltage range (VT1) is generated by the corresponding oscillator tuning voltage range(VT) of about 2 to 7 volts.

Figure 3:
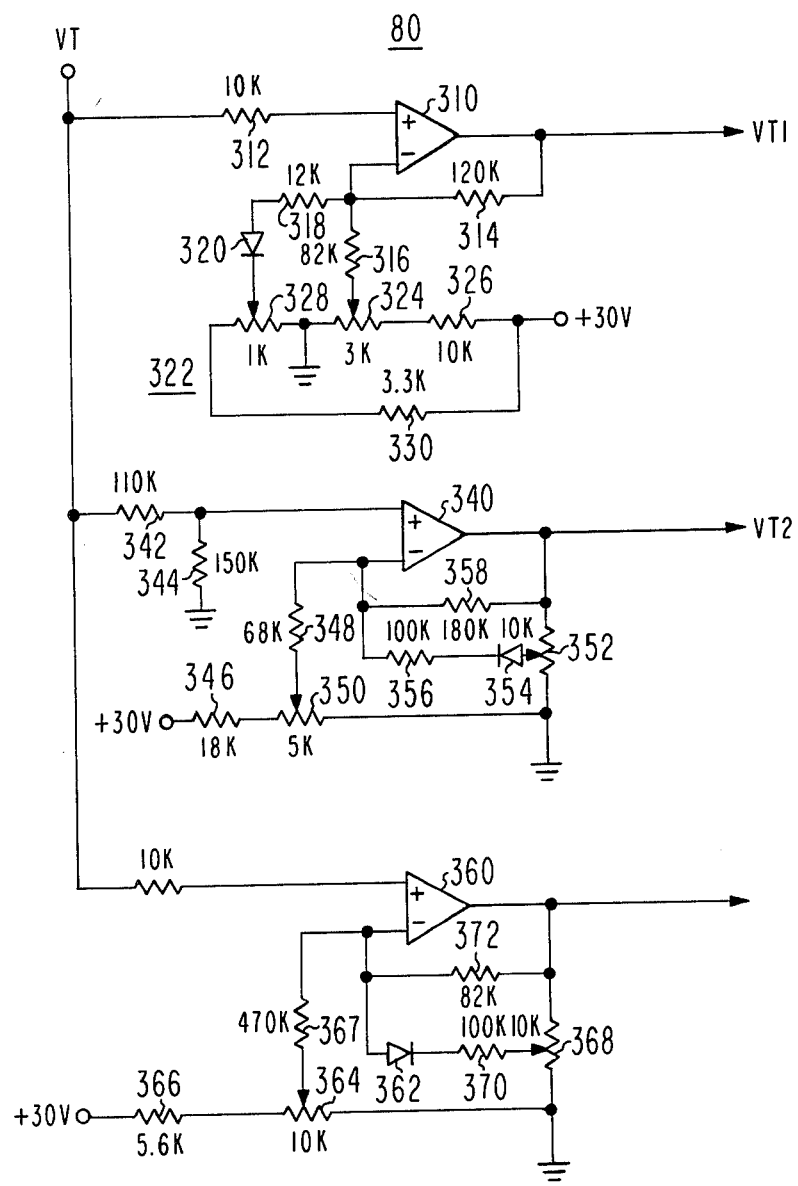
FIG. 3 is a schematic diagram of a non-linear signal processor constructed in accordance with principles of the present invention to accomplish tracking between the RF and LO circuits of the tuning system of FIG. 1.

A preferred embodiment for processor 80 is shown in FIG. 3 and comprises three operational amplifiers (OP AMPS) 310, 340 and 360. Each OP AMP is responsive to the tuning voltage VT for generating tuning voltages VT1, VT2 and VT3 for tunable filters 20, 24 and 14, respectively. Each of the OP AMP circuits includes a voltage establishing circuit for providing to the OP AMP a DC offset voltage corresponding to the difference of the LO and RF tuning voltages at the beginning of each band and a break point voltage corresponding to the intersection point of the straight line segments of FIGS. 2a and 2b. Additionally, the feedback path of each OP AMP includes a voltage sensitive threshold conduction device, e.g., a diode, responsive to the break point voltage for selectively controlling the amount of feedback in the OP AMP circuit. The amount of feedback is changed by the conduction of the device to provide the OP AMP's with a first signal transfer characteristic having a slope corresponding to the lower straight line segments illustrated in FIGS. 2a and 2b, and a second signal transfer characteristic having a slope corresponding to the upper straight line segments.

For OP AMP 310, a resistor 312 couples the LO tuning voltage VT to its non-inverting (+) input. A feedback network coupled between the output of OP AMP 310 and its inverting (−) input includes resistors 314, 316, 318, diode 320 and a voltage establishing circuit 322 including resistors 326 and 330 and potentiometers 324 and 328. For the resistor values illustrated in FIG. 3, potentiometer 328, which receives operating voltage via resistor 330, can be adjusted to provide at its wiper a break point voltage such that when the LO tuning voltage is less than 5.9 volts, diode 320 is reversed-biased and the slope of the transfer characteristic of OP AMP 310 is substantially determined by resistors 314 and 316. Potentiometer 324 receives operating voltage via resistor 326 and can be adjusted to provide at its wiper a DC offset voltage to the inverting input of OP AMP 310 which corresponds to the offset voltage required between the LO tuning voltage VT and the filter tuning voltage VT1 at the lower end of the Low band. This establishes for OP AMP 310 a first signal transfer characteristic corresponding to straight line 206 of FIG. 2a.

For LO tuning voltages greater than 5.9 volts diode 320 becomes forward-biased. When diode 320 is forward-biased, resistor 318 is substantially connected in parallel with resistor 316. This reduces the level of feedback for OP AMP 310, establishing a second signal characteristic having increased slope and corresponding substantially to that of straight line segment 208 of FIG. 2a. Note that since the anode of diode 320 is coupled to the inverting input of OP AMP 310, (which, in an ideal operational amplifier, is caused to have the same voltage as that applied to the non-inverting input) diode 320 becomes forward-biased when the LO tuning voltage exceeds the voltage at the wiper of potentiometer 328 by an amount equal to the junction potential of diode 320. Additionally, since the resistance value of potentiometer 328 is relatively small with respect to the value of resistor 318, adjustment of potentiometer 328 does not substantially affect the impedance of the feedback path for OP AMP 310 when diode 320 is forward-biased. Furthermore, readjustment of either potentiometers 324 or 328 in an iterative manner is not necessary since the wiper of potentiometer 328 is isolated from the remainder of the circuit when diode 320 is reverse-biased.

The generation of tuning voltage VT2 by OP AMP 340 for the High band is similar in principle to the above-described generation of the tuning voltage for the Low band. However, as indicated in FIG. 2a the slope of line 216, required for the upper portion of the piecewise-linear approximation needed to achieve satisfactory performance, is slightly less than unity. Accordingly, to produce a gain less than unity, a voltage divider including resistors 342 and 344 is provided for coupling a reduced version of LO tuning voltage to the non-inverting input of OP AMP 340. Additionally, the slope of the transfer characteristic must decrease after reaching a predetermined LO tuning voltage. Thus, for OP AMP 340, resistor 346 couples operating voltage to the wiper of potentiometer 350 for supplying via resistor 348 a DC offset voltage to its inverting input for establishing the proper starting point of straight line segment 216 for the High band. The slope for the transfer characteristic is determined by resistor 358. Potentiometer 352 is adjusted to provide a break point voltage at its wiper corresponding to the intersection point of lines 214 and 216. When the RF tuning voltage VT2 increases to the point that diode 354 becomes forward-biased, resistor 356 is substantially coupled in parallel with resistor 358, thus reducing the gain of OP AMP 340 to match the slope of straight line segment 214, thus completing a piecewise-linear approximation of satisfactory RF/LO tracking for the High band. It should be noted that the feedback arrangement for OP AMP 340 could be the same as for OP AMP 310 except that diode 320 could be poled in the opposite direction. This, however, would result in a confusing alignment procedure because both potentiometer adjustments would affect the low frequency end of the high band, and different alignment procedures would be needed for the low and high bands.

For the UHF tuning band, operational amplifier 360 is biased similarly to the arrangement described above with respect to OP AMP 340. However, instead of having a transfer characteristic which must decrease after a specific point, the transfer characteristic for OP AMP 360 must decrease after the intersection of straight line segments 218 and 220 of FIG. 2b in order to provide piecewise-linear approximation of satisfactory tracking in the UHF-band. Consequently, diode 362 is poled oppositely from diode 354 and potentiometer 368 is adjusted so that resistors 370 and 372 are substantially coupled in parallel so as to establish the slope of straight line segment 218. Potentiometer 364 receives operating potential from resistor 366 and provides a DC offset voltage at its wiper which is applied by resistor 367 to the inverting input of OP AMP 360 for establishing the beginning point of straight line segment 218. Potentiometer 368 is adjusted so that when the UHF filter tuning voltage VT3 is approximately 7.5 volts, diode 362 becomes reverse-biased, removing resistor 370 from the feedback path of OP AMP 360 and changing the slope of its transfer characteristic from straight line segment 218 to straight line segment 220. This completes the RF/LO tracking required for satisfactory operation of the FIG. 1 tuning system.

Modifications of the described tracking arrangement are considered to be within the scope of the appendant claims. For example, some resistors of the feedback network of the OP AMPs of FIG. 3 can be made variable in order to allow adjustment of the slope of each straight line segment of the piecewise-linear approximations. Thus, for OP AMP 310, fixed resistors 316 and 318 can be replaced by potentiometers. Furthermore, additional diodes can be coupled to the inverting input of the OP AMP's so as to providing multiple break points in the piecewise-linear approximations for providing a more accurate tracking.

I claim:

1. In a multiband tuning system for providing an IF signal from RF signals residing in a signal band, apparatus comprising
    filter means for selecting RF signals corresponding to a selected channel in said band in response to a filter tuning control signal having a first variation range;
    mixing means responsive to said selected RF signals and a local oscillator signal for frequency translating said selected RF signals to develop said IF signal;
    oscillator means for generating said local oscillator signal in response to an oscillator tuning control signal having a second variation range for said band, said second range of variation being substantially less than said first range; and
    DC signal translating means including an amplifier having an input responsive to said oscillator tuning control signal and having at least first and second predetermined gain transfer characteristics for modifying said oscillator tuning control signal and for providing at an output said filter tuning control signal, and including switch means for changing the gain transfer characteristic of said amplifier from said first to said second transfer characteristic in response to one of said tuning control signals so as to derive a piecewise-linear approximation of the other of said tuning control signals.

2. The tuning system of claim 1 wherein said switch means includes a voltage establishing circuit for developing a first bias voltage and a threshold conduction device responsive to one of said oscillator and filter tuning control signals and to said first bias voltage for changing the gain of said amplifier at a predetermined level of said one tuning control signal so as to provide a break point between said first and second gain transfer characteristics.

3. The tuning system of claim 2, wherein said voltage establishing circuit develops a second bias voltage and applies said second bias voltage to said amplifier for establishing a predetermined DC offset between said oscillator and filter tuning control signals.

4. The tuning system of claim 3 wherein said amplifier comprises an operational amplifier having said oscillator tuning control signal coupled to its non-inverting input and said threshold conduction device coupled to its inverting input, said voltage establishing circuit providing said second bias voltage to said inverting input so as to establish said predetermined DC offset between said oscillator and said filter tuning control signals.

5. The tuning system of claim 4 wherein said voltage establishing circuit provides said first bias voltage to said threshold conduction device for establishing its conduction threshold point.

6. The tuning system of claim 4 wherein the output of said operational amplifier is coupled to said threshold conduction device for controlling its conduction threshold point.

7. The tuning system of claim 1 wherein said signal band comprises a first broadcast band, a first cable band, a second broadcast band and a second cable band.

8. In a multiband tuning system for producing an IF signal from RF signals corresponding to respective channels which may be selected residing in, in the order named, a first broadcast band, a first cable band, a second broadcast band, and a second cable band, apparatus comprising:

a single local oscillator means for generating, without the use of switched reactive components, said local oscillator signal and controlling its frequency in a frequency range sufficient to develop said IF signal for any selected channel in any of said above named bands in response to an oscillator tuning control signal;

control means for generating said oscillator tuning control signal in accordance with said selected channel;

filter means for selecting the RF signal corresponding to a selected channel in response to a filter control signal;

mixing means responsive to said selected RF signal and said local oscillator signal for frequency translating said selected RF signal to develop said IF signal; and DC signal translating means including amplifier means having an input responsive to said oscillator tuning control signal and having at least first and second predetermined gain transfer characteristics for modifying said oscillator tuning signal for providing at an output said filter tuning control signal and including switch means coupled to said amplifier means for changing the gain transfer characteristic of said amplifier means from said first to said second transfer characteristic in response to one of said oscillator and filter tuning control signals.

9. The tuning system of claim 8 wherein said switch means includes a voltage establishing circuit for developing a first bias voltage and threshold conduction device responsive to one of said oscillator and filter tuning control signals and to said first bias voltage for changing the gain of said amplifier means at a predetermined level of said one tuning control signal so as to provide a break point between said first and second gain transfer characteristic.

10. The tuning system of claim 9 wherein said voltage establishing circuit develops a second bias voltage and applies said second bias voltage to said amplifier means for establishing a predetermined DC offset between said oscillator and filter tuning control signals.

11. The tuning system of claim 10 wherein said amplifier means comprises an operational amplifier having said oscillator tuning control signal coupled to its non-inverting input and said threshold conduction device coupled to its inverting input , said voltage establishing circuit providing said second bias voltage to said inverting input so as to establish said predetermined DC offset between said oscillator and said filter tuning control signals.

12. The tuning system of claim 11 wherein said voltage establishing circuit provides said first bias voltage to said threshold conduction device for establishing its conduction threshold point.

13. The tuning system of claim 11 wherein the output of said operational amplifier is coupled to said threshold conduction device for controlling its conduction threshold point.

* * * * *